United States Patent [19]

Hafle et al.

[11] Patent Number: 4,628,298
[45] Date of Patent: Dec. 9, 1986

[54] CHAIN CODE ENCODER

[75] Inventors: Ralph S. Hafle, Benton; Mark D. Love, Littlerock, both of Ark.

[73] Assignee: BEI Motion Systems Company, Inc., Santa Barbara, Calif.

[21] Appl. No.: 623,843

[22] Filed: Jun. 22, 1984

[51] Int. Cl.$^4$ ............................................. H03M 1/00
[52] U.S. Cl. ........................... 340/347 P; 340/347 DD
[58] Field of Search .................... 340/347 P, 347 DD; 318/600

[56] References Cited

U.S. PATENT DOCUMENTS 3,461,449  8/1969  Baskin et al. .................... 340/347 P
3,531,798  9/1970  Bureau ............................. 340/347 P
3,702,471  11/1972  Kennedy et al. ................. 340/347 P

OTHER PUBLICATIONS

"Shaft Encoder with Single Track", Martino, IBM Technical Disclosure, pp. 2653-2654, vol. 19, No. 7, 12/76.

"Bidirectional Position Encoder", Elliott, IBM Technical Disclosure, pp. 1180-1182, vol. 14, No. 4, 9/71.

Primary Examiner—Bernard Roskoski
Attorney, Agent, or Firm—Limbach, Limbach & Sutton

[57] ABSTRACT

A positional encoder which provides absolute position information from a single code track. A chain code track is positioned on a code disk to supply position words of N consecutive bits, each position word being unique and corresponding to a different position of the code disk. Means are provided for detecting the elements of the chain code as the code disk is rotated with respect to a fixed point. The position data are accumulated in the order received and N consecutive bits are examined to determine the position to which the bits correspond.

15 Claims, 15 Drawing Figures

CODE SEQUENCE: 1 1 1 1 0 1 1 0 0 1 0 1 0 0 0 0
⌒10
WORD #4: 1 1 0 1 1
WORD #6: 1 0 1 1
WORD #10: 0 0 1 0
WORD #14: 1 0 0 0
WORD #15: 0 0 0 0
| WORD # | WORD |
|---|---|
| 0 | 0001 |
| 1 | 0011 |
| 2 | 0111 |
| 3 | 1111 |
| 4 | 1110 |
| 5 | 1101 |
| 6 | 1011 |
| 7 | 0110 |
| 8 | 1100 |
| 9 | 1001 |
| 10 | 0010 |
| 11 | 0101 |
| 12 | 1010 |
| 13 | 0100 |
| 14 | 1000 |
| 15 | 0000 |
FIG._1A.
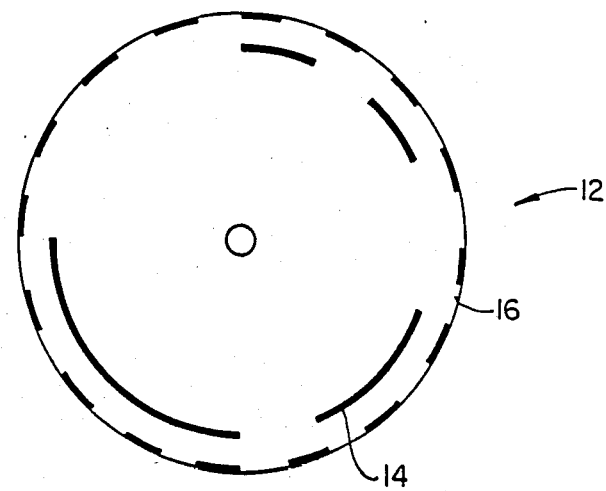
FIG._1B.

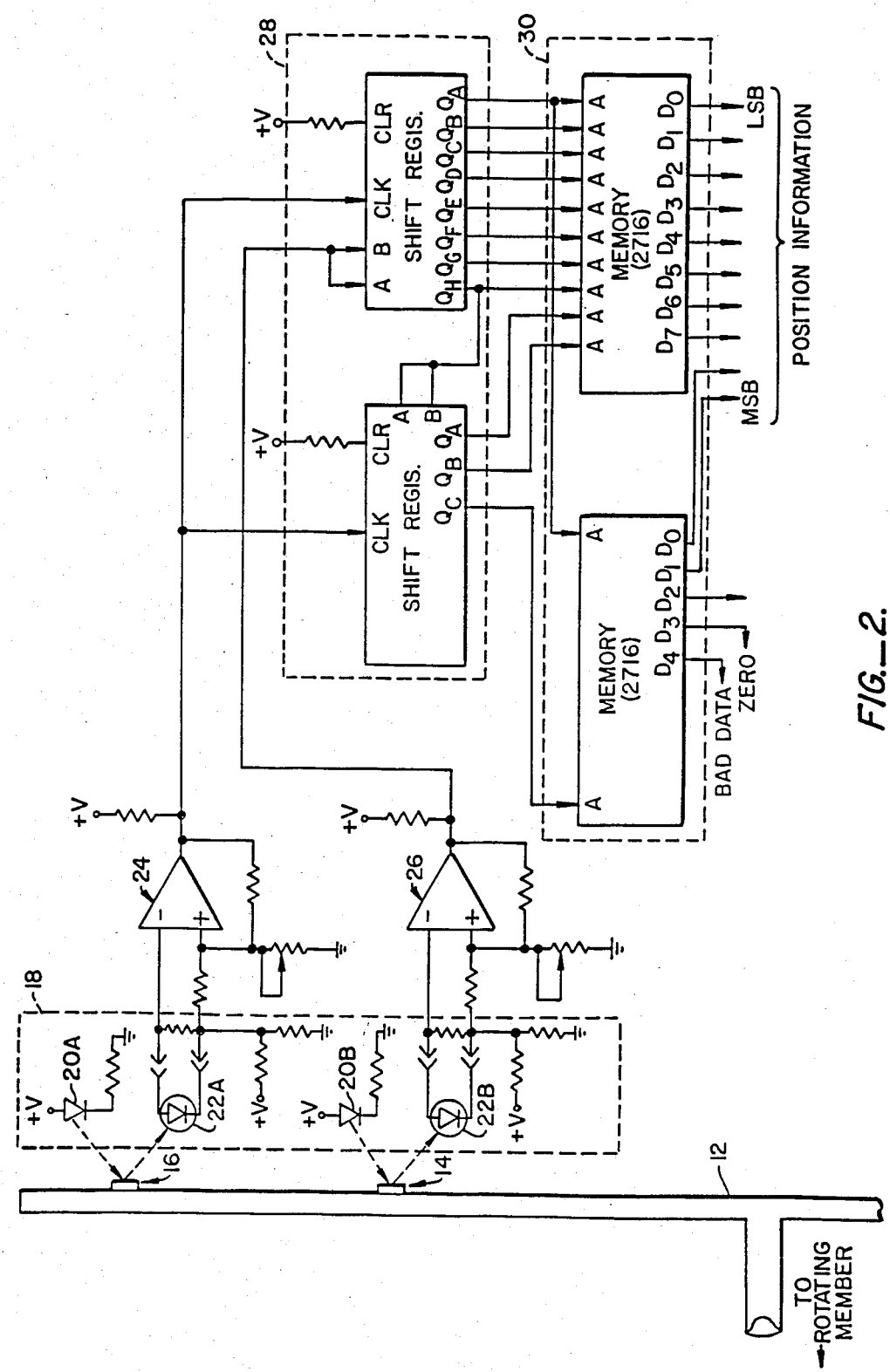
FIG._2.

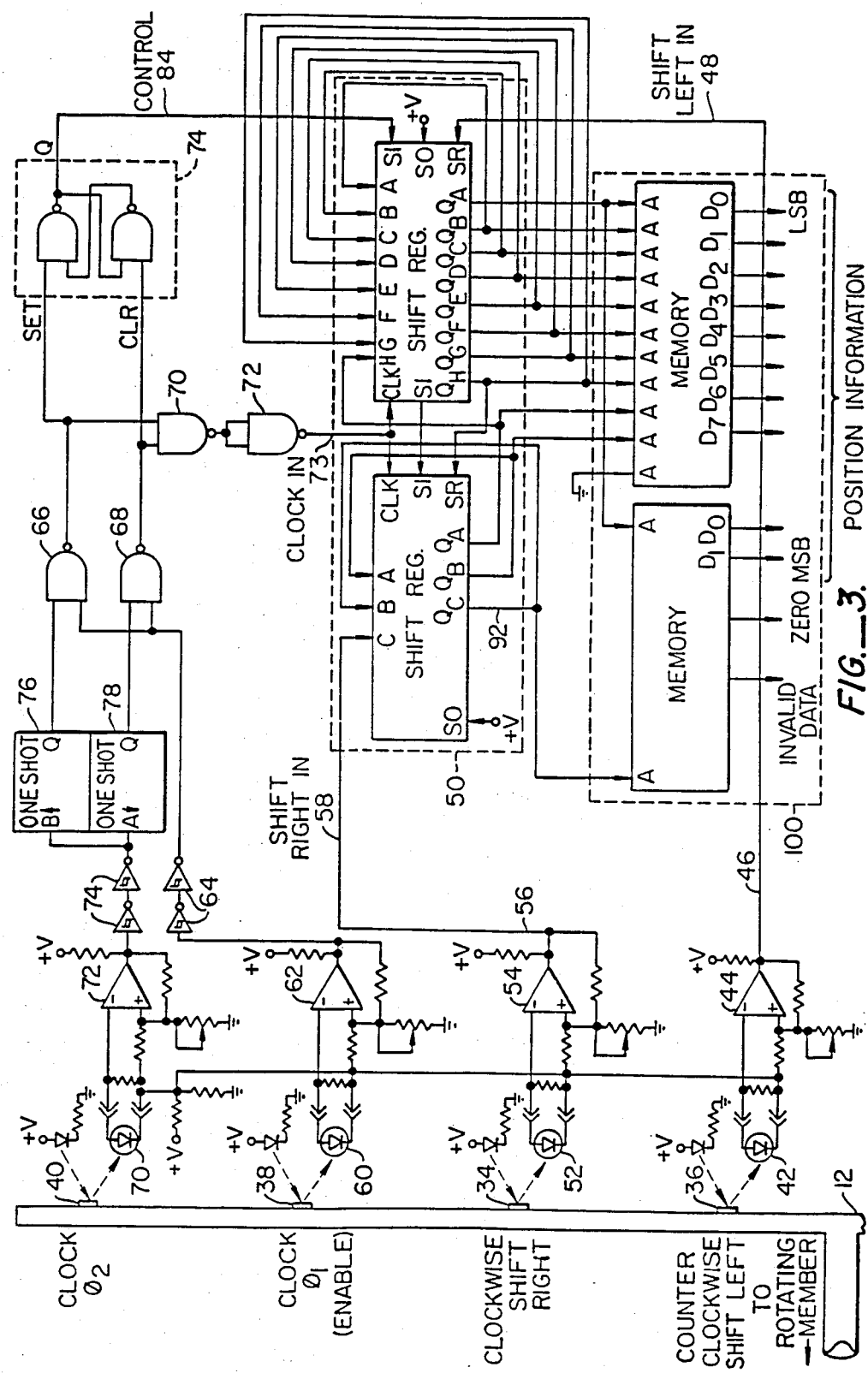
FIG._3.

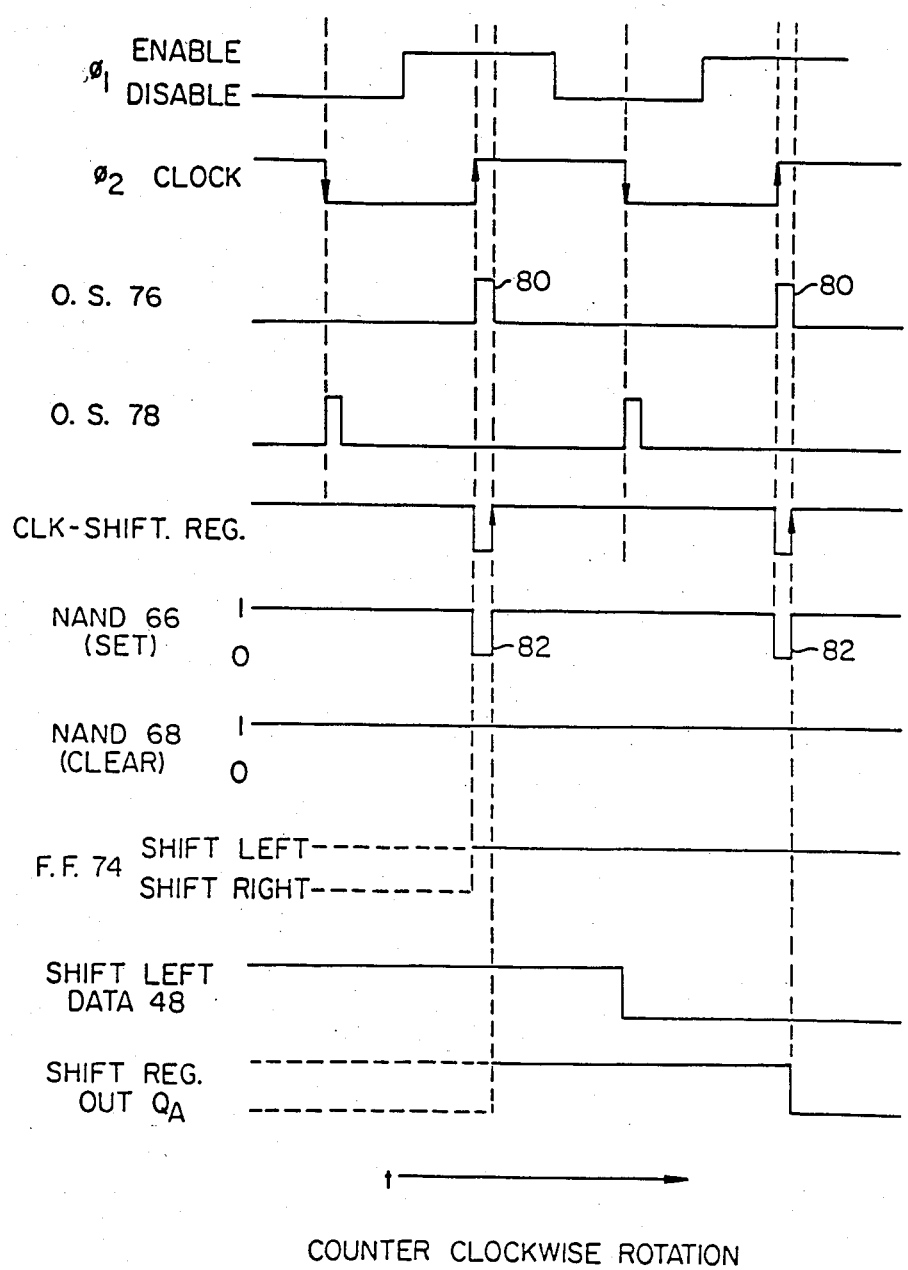
FIG._4A.

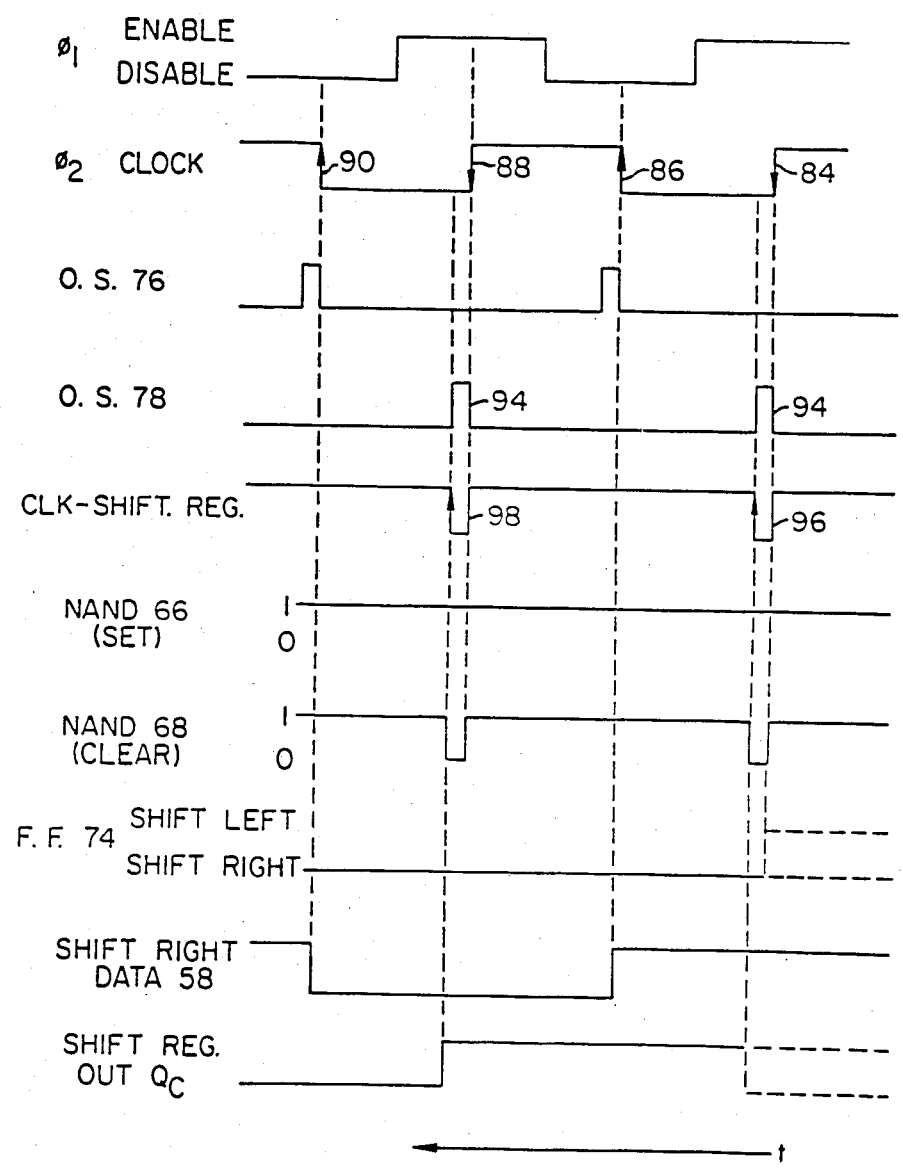
FIG._4B.

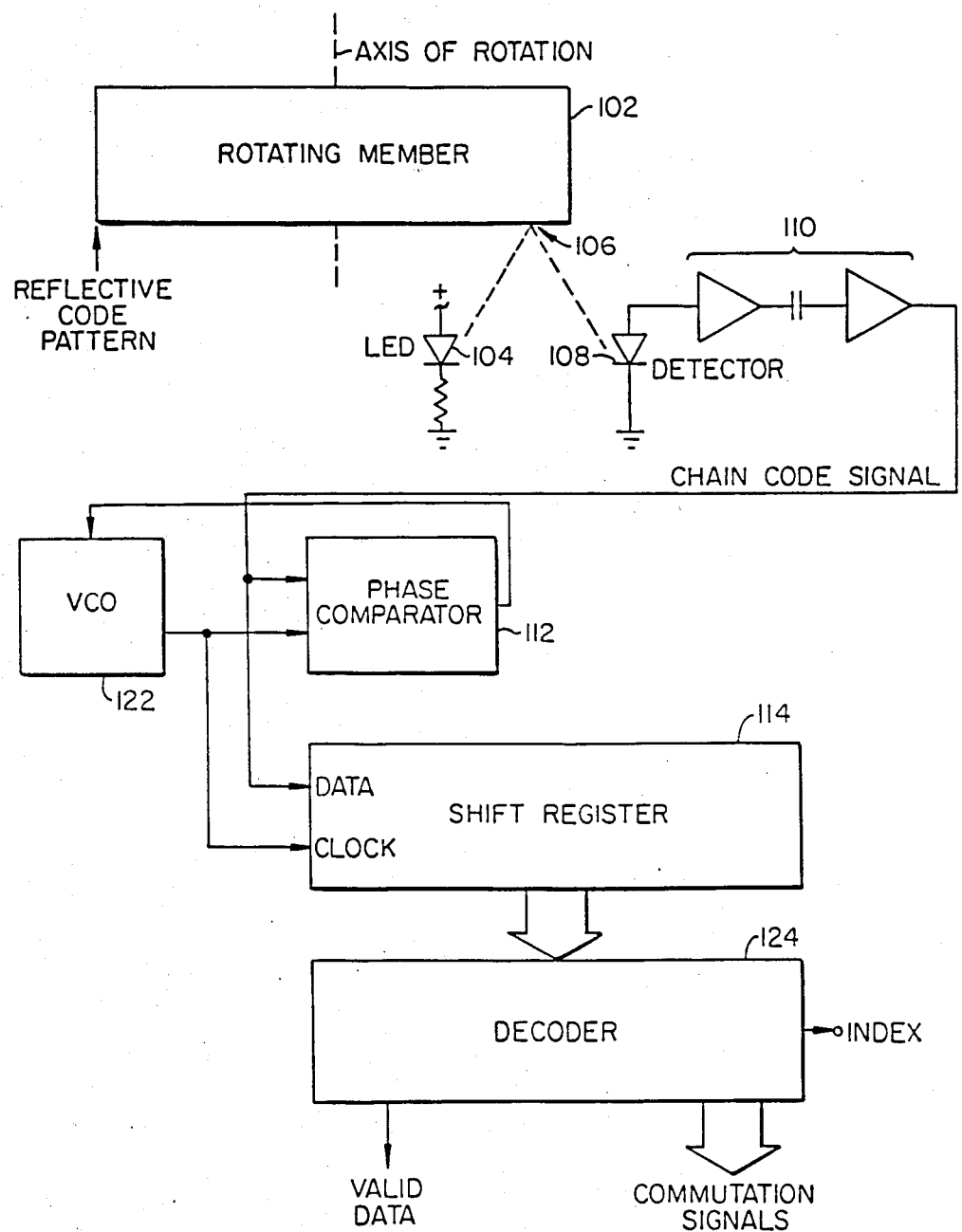
FIG._5.

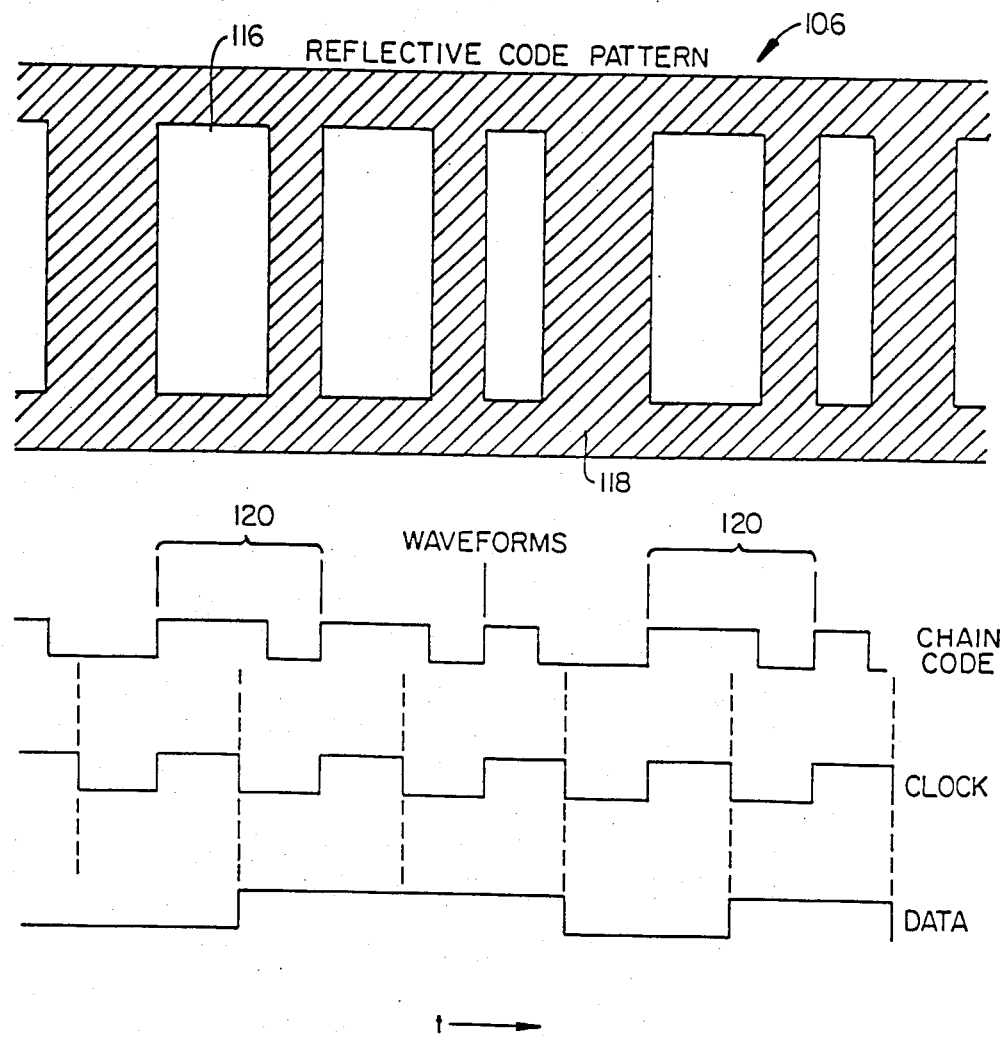
FIG._6.

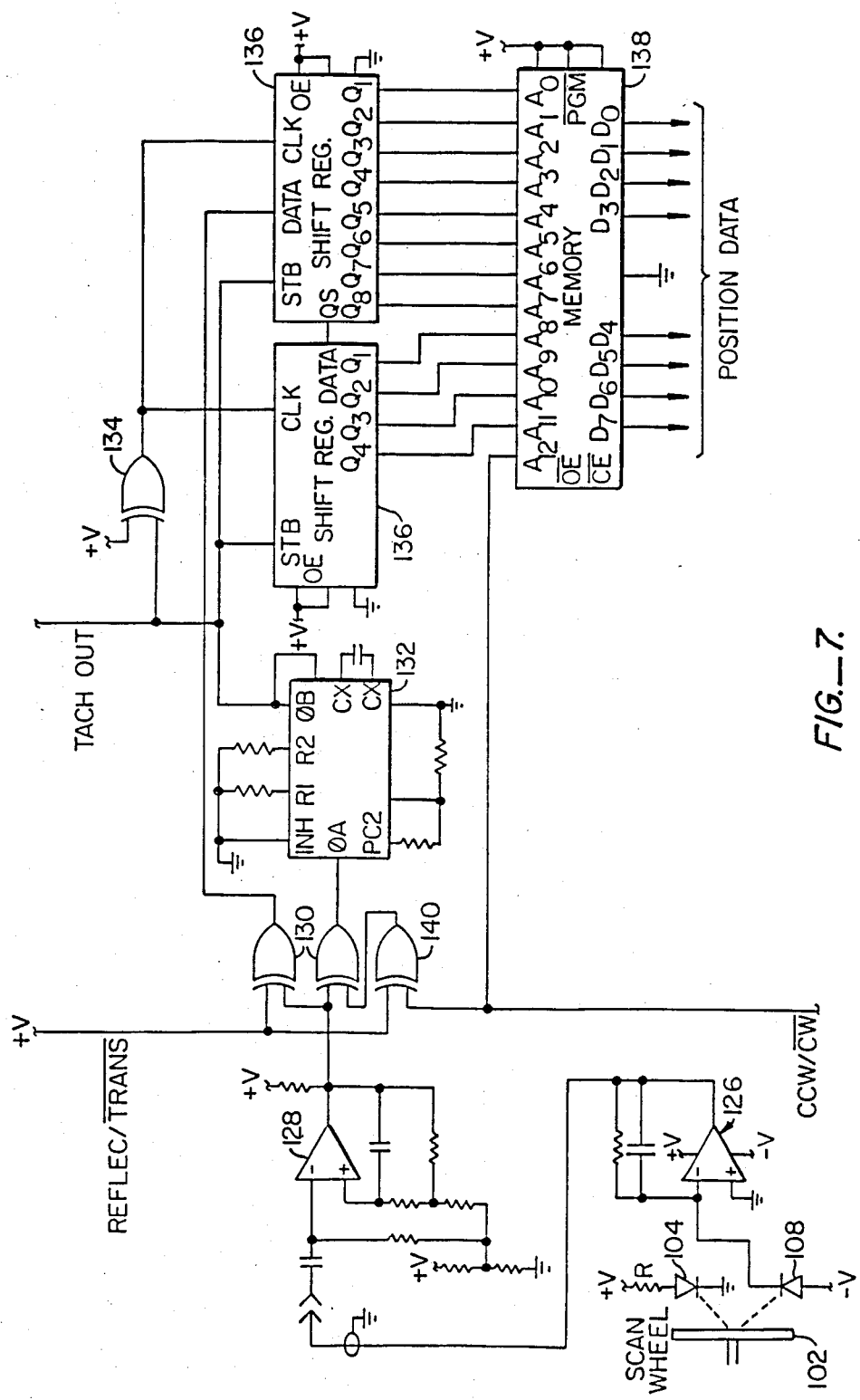
FIG._7.

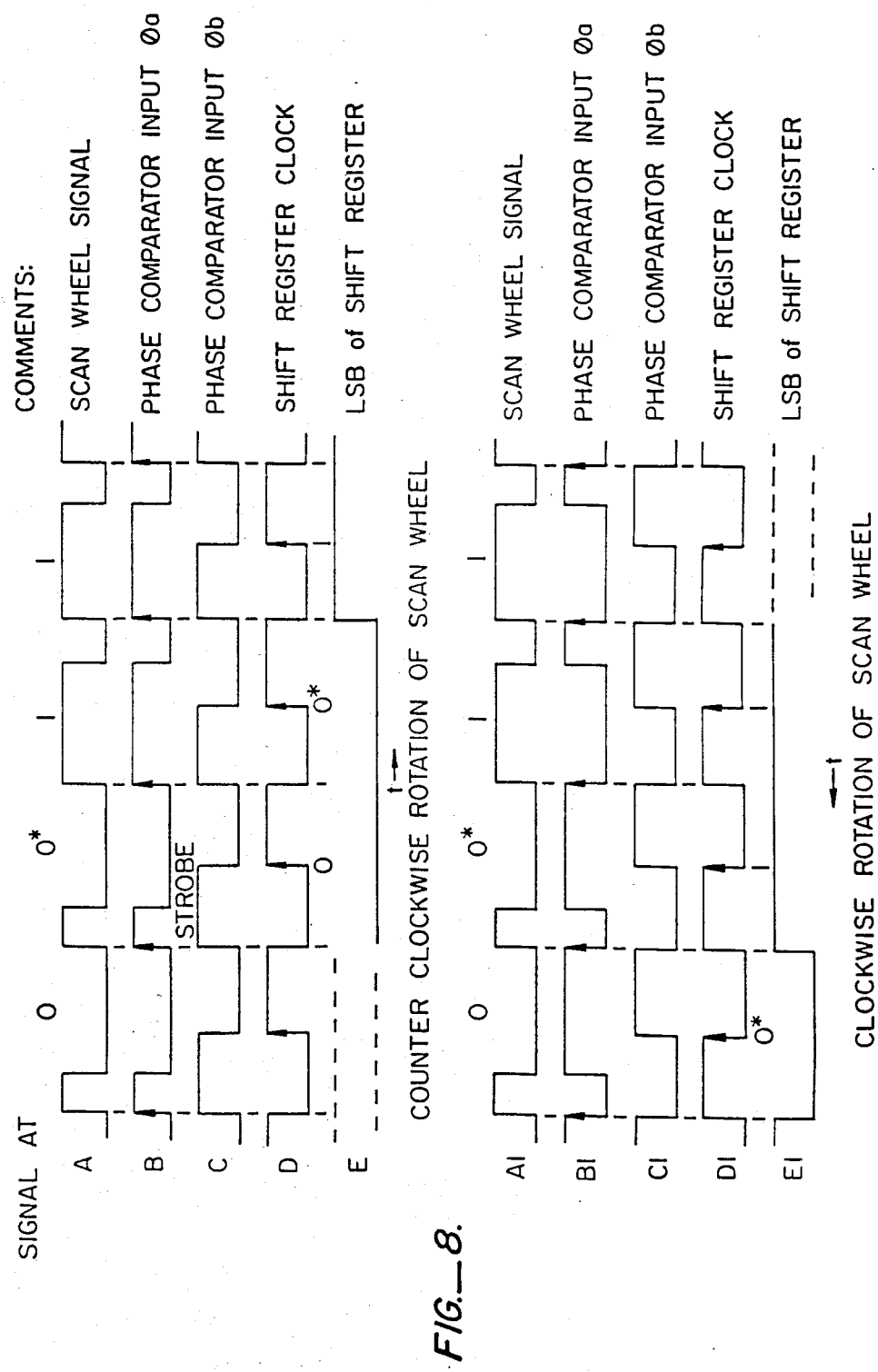
FIG._8.

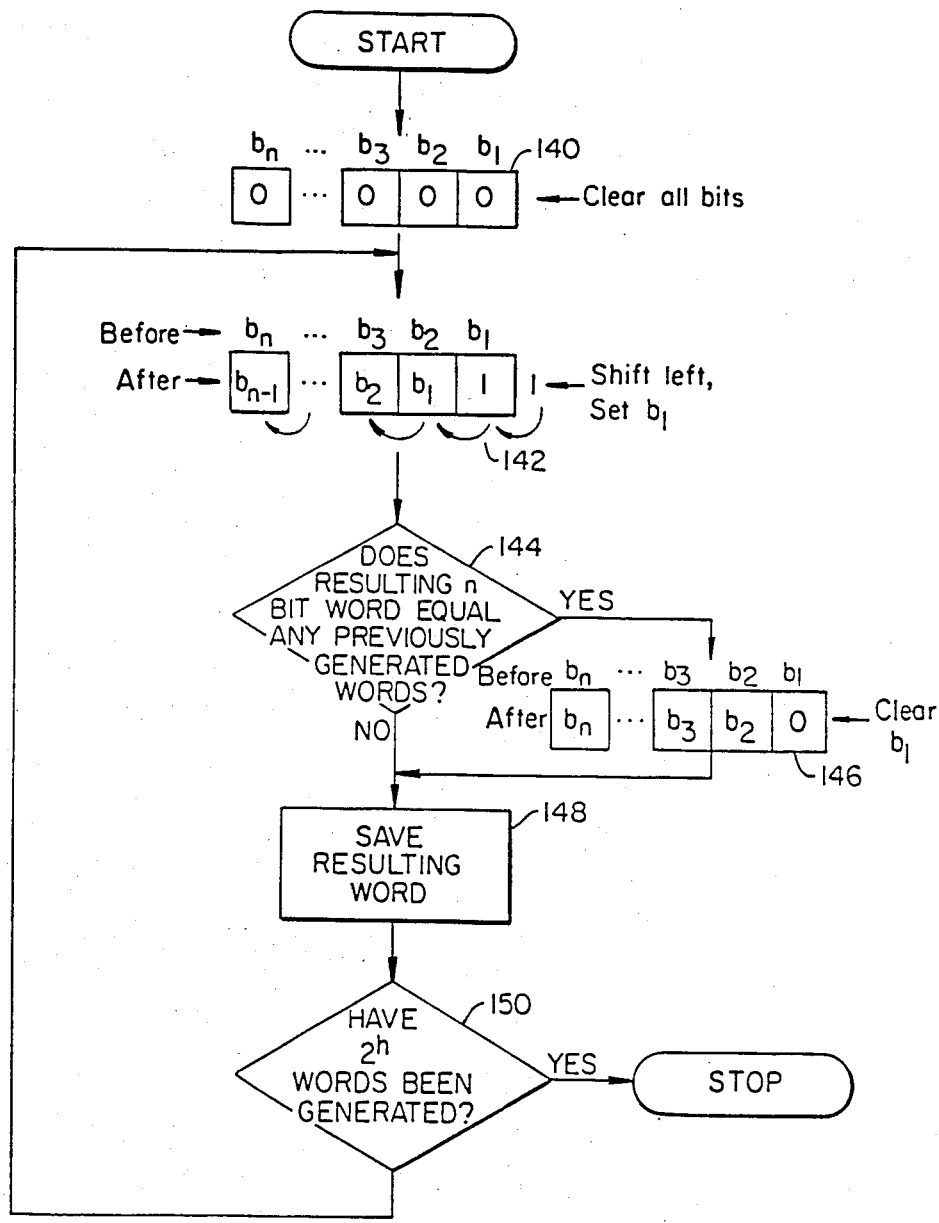
FIG._9.

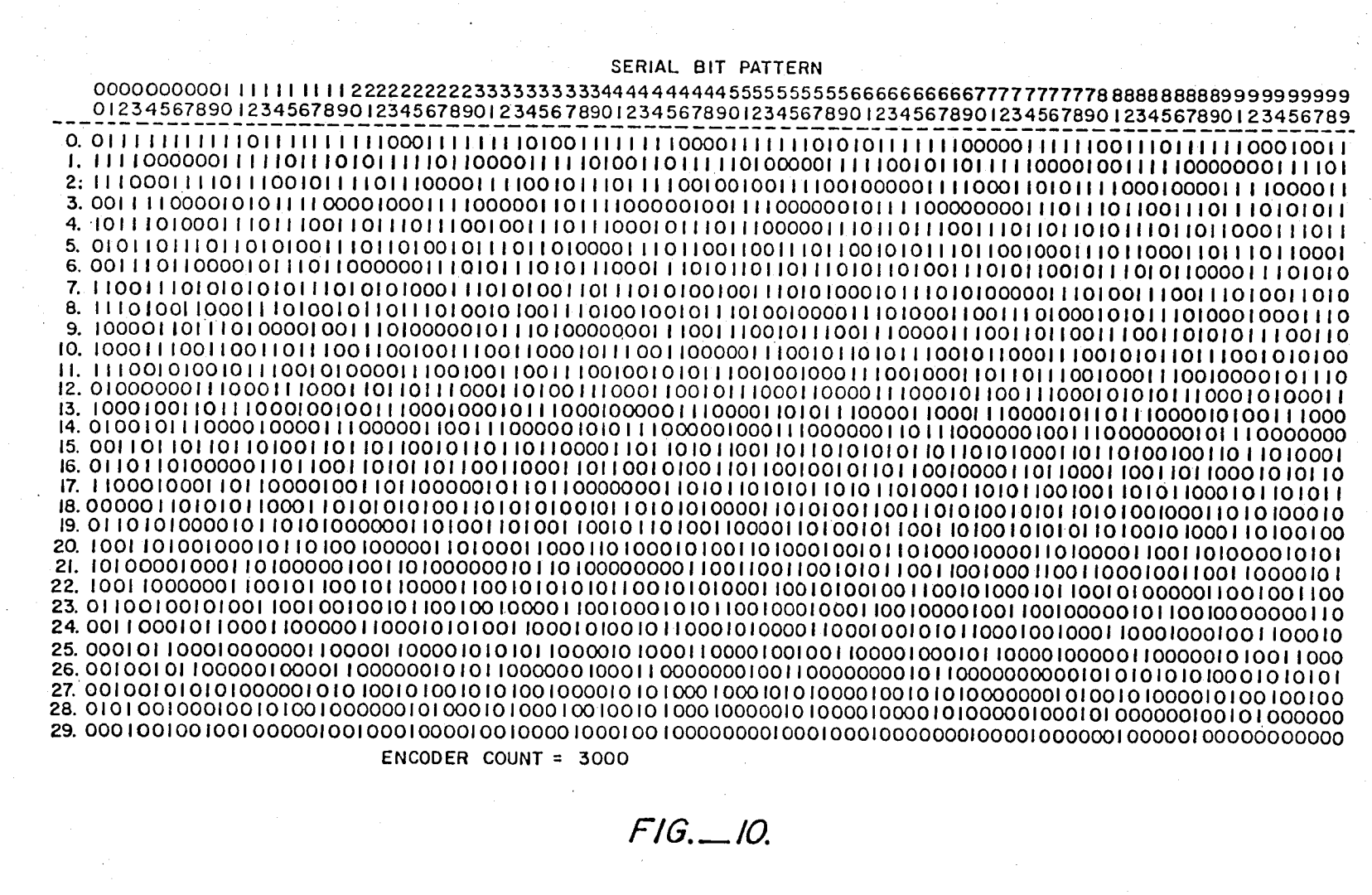

FIG._10.

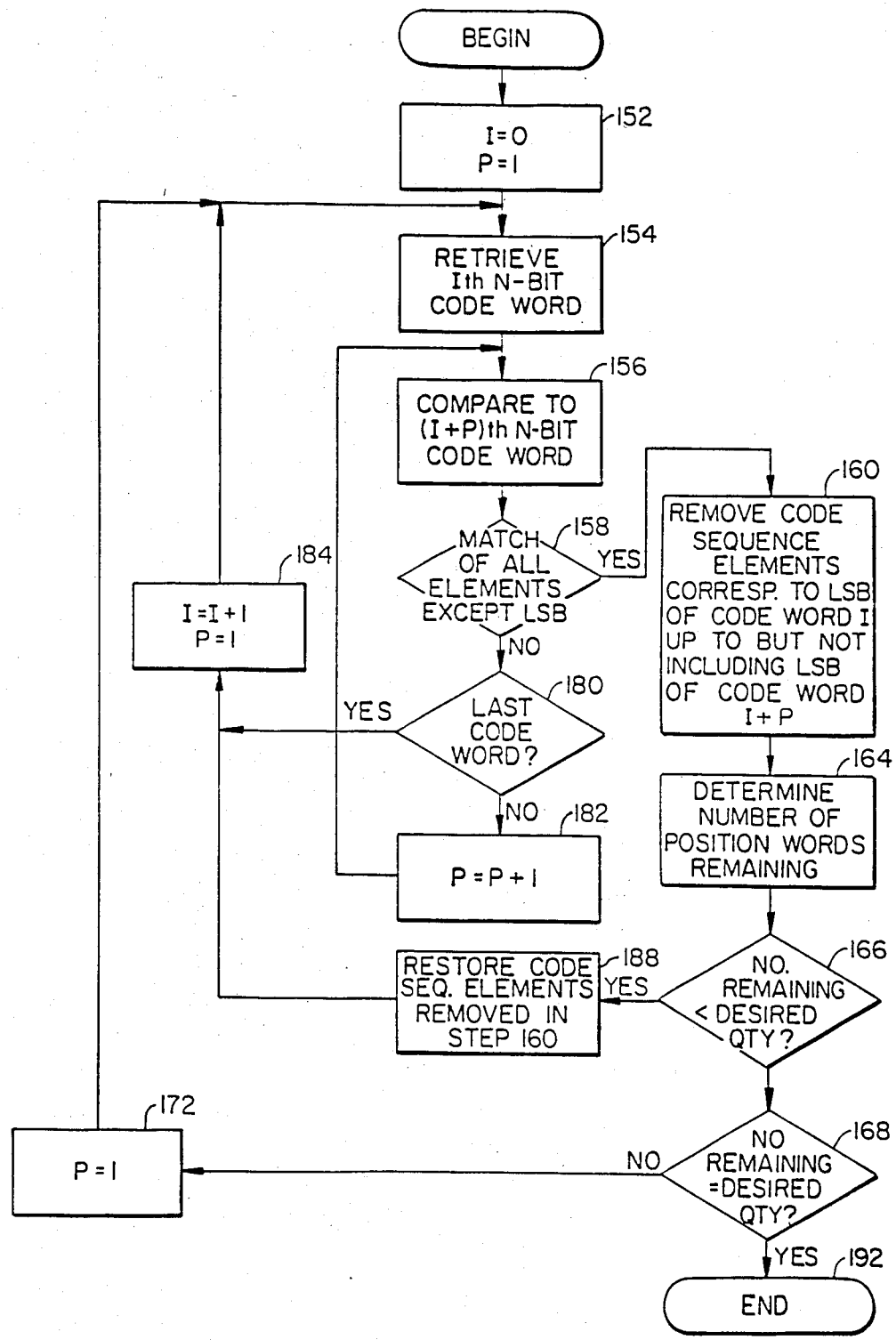
FIG._11.

ORIGINAL SEQUENCE (16 ELEMENTS, 16: 4-BIT WORDS):
1 1 1 1 0 1 1 0 0 1 0 1 0 0 0 0
| 16 WORD SEQ /174 | | | | | 1ST ITERATION /176 | | | | | 2ND ITERATION /178 | | | | |
|---|---|---|---|---|---|---|---|---|---|---|---|---|---|---|
| I | WORD | | | /162 | I | WORD | | | | I | WORD | | | |
| 0 | 1 | 1 | 1 | (1) | 0 | 1 | 1 | 1 | 0 | 0 | 1 | 1 | 1 | 0 |
| 1 | 1 | 1 | 1 | 0 | 1 | 1 | 1 | 0 | (1) /186 | 1 | 1 | 1 | 0 | 0 |
| 2 | 1 | 1 | 0 | 1 | 2 | 1 | 0 | 1 | 1 | 2 | 1 | 0 | 0 | 1 |
| 3 | 1 | 0 | 1 | 1 | 3 | 0 | 1 | 1 | (0) | 3 | 0 | 0 | 1 | 0 /190 |
| 4 | 0 | 1 | 1 | 0 | 4 | 1 | 1 | 0 | 0 | 4 | 0 | 1 | 0 | (1) |
| 5 | 1 | 1 | 0 | 0 | 5 | 1 | 0 | 0 | 1 | 5 | 1 | 0 | 1 | (0) |
| 6 | 1 | 0 | 0 | 1 | 6 | 0 | 0 | 1 | 0 | 6 | 0 | 1 | 0 | 0 |
| 7 | 0 | 0 | 1 | 0 | 7 | 0 | 1 | 0 | 1 | 7 | 1 | 0 | 0 | 0 |
| 8 | 0 | 1 | 0 | 1 | 8 | 1 | 0 | 1 | 0 | 8 | 0 | 0 | 0 | 0 |
| 9 | 1 | 0 | 1 | 0 | 9 | 0 | 1 | 0 | 0 | 9 | 0 | 0 | 0 | 1 |
| 10 | 0 | 1 | 0 | 0 | 10 | 1 | 0 | 0 | 0 | 10 | 0 | 0 | 1 | 1 |
| 11 | 1 | 0 | 0 | 0 | 11 | 0 | 0 | 0 | 0 | 11 | 0 | 1 | 1 | 1 |
| 12 | 0 | 0 | 0 | 0 | 12 | 0 | 0 | 0 | 1 | | | | | |
| 13 | 0 | 0 | 0 | 1 | 13 | 0 | 0 | 1 | 1 | | | | | |
| 14 | 0 | 0 | 1 | 1 | 14 | 0 | 1 | 1 | 1 | | | | | |
| 15 | 0 | 1 | 1 | 1 | | | | | | | | | | |
FINAL SEQUENCE (10 ELEMENTS, 10: 4-BIT WORDS):
0 0 1 0 0 0 0 1 1 1
FIG._12.
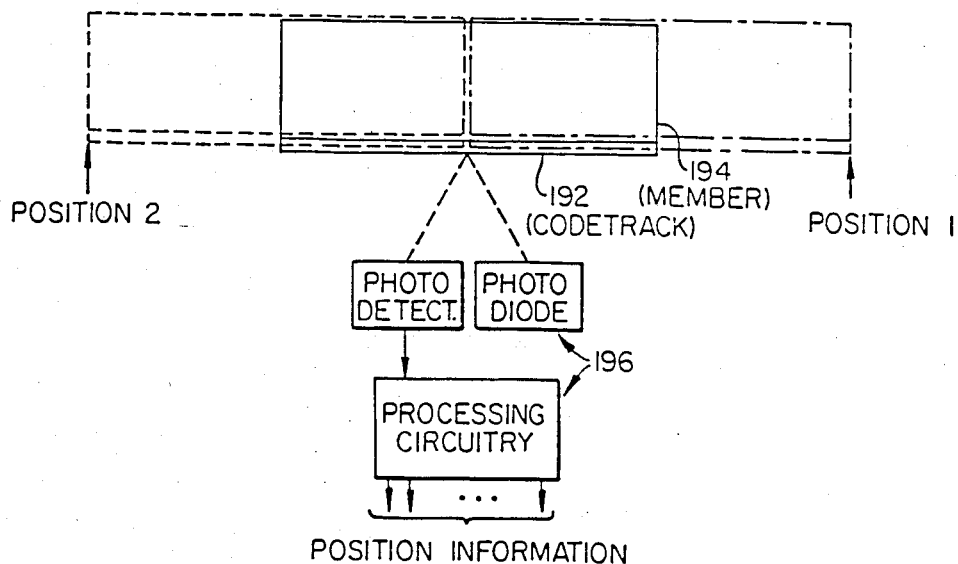
FIG._13.

CHAIN CODE ENCODER

DESCRIPTION

1. Technical Field

The present invention is directed generally to position indicating systems, and more particularly to a chain code encoder.

2. Background Art

In the encoder art there are generally two generic forms of encoders: incremental encoders and absolute encoders.

The former type of encoder utilizes a counter arrangement to count the number of code elements which have passed in registration with a detector and, from the count and information on the direction of rotation, provides a position indication. The advantages of such an arrangement are that only two code channels in quadrature are needed; i.e. two detectors and two code tracks.

A significant disadvantage of the incremental encoder is that a substantial amount of processing circuitry is required to ensure that the count is accurate. With an incremental encoder, the accuracy of the count is dependent upon the accuracy with which each incremental position change can be detected. An error in the detection of any one incremental position change will have an impact on all subsequent position readings.

At the other extreme is the absolute encoder which provides a unique code word for each incremental position of the encoder. One substantial disadvantage of the absolute encoder is that a significant number of separate code tracks, and hence processing channels, are required to generate each code word. As the positional resolution of the encoder increases the number of tracks required also increases. Where the physical size of the encoder is required to be small the number of tracks which can be used is limited. Thus, the resolution is also limited. As the number of required tracks increases, the complexity of generating and constructing the actual code tracks on the code disk also increases. In turn, this leads to an increase in the cost of the encoder and the amount of alignment and manufacturing time required to render the encoder operational.

An immediately obvious advantage of the absolute encoder is that each incremental position is uniquely defined by a distinct code word, which code word does not depend upon the state of adjacent code words for its generation. A further disadvantage of absolute encoders is the requirement of detector assemblies for each code track, and the accompanying problems with aligning each such detector with its corresponding code track.

There is therefore a need for a positional encoder which requires a minimum number of code tracks but which provides a positional output which has a minimal dependence upon the state of previous or subsequent positional indications, and which requires a minimal amount of processing circuitry.

DISCLOSURE OF THE INVENTION

The foregoing and other problems of previous positional encoders are overcome by the present invention of a positional encoder including code means positioned for rotation with the rotating member for which positional information is desired, the code means including a code sequence of code cycles arranged circumferentially about the axis of rotation of the rotating member. Each code cycle is associated with a unique position of the rotating member and provides position data, wherein the position data from each code cycle, in combination with the position data from adjacent $N-1$ consecutive code cycles, defines a pattern which is unique from the pattern formed by position data from any other N consecutive code cycles in the code sequence. Each such N consecutive code cycles thereby identify a unique position of the rotating member. Means are provided for reading each code cycle of the code sequence which is brought into registration with a monitoring point as the rotating member is rotated, wherein the monitoring point is fixed in position relative to the rotating member. Means are provided which receive the code cycles being read and which extract the position data from the code cycles. These means thereafter temporarily store the position data in the order received. Finally, means are provided for converting the consecutive sequence of the N most recently received position data into positional information.

An encoder constructed in accordance with the present invention fills an intermediate position in cost and complexity between absolute position encoders and incremental position encoders. The present invention utilizes a code track which provides absolute position information in a single code ring. Unlike an absolute position encoder in which an N-bit code word is derived from N rings, the N-bit code word of the present invention is derived from N circumferentially adjacent zones of one code ring, wherein the code ring has $2^N$ zones. Each such zone is $(two\ pi)/(2^N)$ radians wide.

Further, in the event of a power failure, the present invention becomes operational after rotation through a very small angle—typically that angle which permits the sampling of $N+1$ code elements. This is in contrast to incremental encoders which must rotate through a substantial number of elements (typically, at least one half rotation's worth) in order to reach a reference mark, before the encoder becomes operational.

One embodiment of the present invention utilizes, for a particular direction, a code ring containing the positional data in code cycles, and a clock ring by which the reading of the code ring can be synchronized. For rotation in the opposite direction a separate code ring containing positional code cycles is provided along with a second clock ring. The second clock ring is positioned in quadrature with respect to the first clock ring. Means are provided for examining the relative signal transitions in the first and second clock rings to determine the direction of rotation, and hence to select the code ring to be used, and to derive synchronizing information therefrom.

In a further embodiment of the present invention clock and positional data are derived solely from a single code ring. In this embodiment, position data are encoded within the cycles of the code ring by varying the duty cycle of a each code cycle as a function of the value of the position data to be encoded. The synchronizing data are embedded in the positional data in the form of a code cycle transition at a fixed interval uniformly throughout the code cycles of the code ring. The synchronizing data can therefore be easily extracted from the position data of the code ring and utilized with decoding circuitry to sample each code cycle at the appropriate point in the cycle. In turn, the value of the code cycle at the sampling point indicates the duty cycle of the code cycle and hence the value of the position data.

The structure of the present invention in the use of decoding means to convert the position words into positional information permits numerous applications. For example, the present invention can be easily adapted to provide commutation signals for electric motors. For example, a commutation encoder for a twelve pole motor will have a code disk having three low resolution tracks specifically dedicated to motor commutation. Each track will provide six cycles and each track will be shifted 120 electrical degrees from the others. In accordance with the present invention, such motor commutation tracks are unnecessary. Instead, the decoding means are structured to include a motor commutation table which is correlated to the position data. When the appropriate position word is received, the decoding means output the appropriate motor commutation signal on the appropriate lines.

It is therefore an object of the present invention to provide a positional encoder in which absolute position data are included in a single code ring.

It is another object of the present invention to provide a positional encoder which requires a minimum of code tracks in order to provide absolute position data.

It is a further embodiment of the present invention to provide a positional encoder in which synchronizing and absolute position data are embedded within a single code ring.

It is still another object of the present invention to provide a bi-directional positional encoder which employs chain code encoding.

It is a further object of the present invention to provide a positional encoder in which positional information is provided in a single code ring wherein the positional information is provided absolutely by a predetermined number of consecutive code cycles in the code ring.

It is still another object of the present invention to provide a positional encoder having a cost and complexity which falls between that of incremental encoders and absolute encoders.

It is a still further object of the present invention to provide a positional encoder in which a single code track is read in a manner similar to that for incremental encoders, but wherein consecutive positional data from the code track provide absolute positional information.

It is another object of the present invention to provide a positional encoder which employs a chain code track and which provides commutation information for a motor.

These and other objectives features and advantages of the present invention will be more readily understood upon consideration of the following detailed description of certain preferred embodiments and the accompanying drawings.

BRIEF DESCRIPTION OF THE DRAWINGS

FIG. 1A illustrates a four bit chain code sequence.

FIG. 1B a simplified illustration of a code disk which contains a four bit chain code along with a clock ring.

FIG. 2 is a schematic diagram of a monodirectional chain code encoder.

FIG. 3 is a schematic representation of the circuitry for processing a bi-directional chain code embodiment of the present invention.

FIGS. 4A and 4B are timing diagrams for the circuitry of FIG. 3 for clockwise and counterclockwise rotation.

FIG. 5 is a functional block diagram of a chain code encoder with position and clock information embedded in a single code sequence.

FIG. 6 illustrates the manner in which the position and synchronization data are embedded in the code track and illustrates a physical embodiment of such a track.

FIG. 7 is a schematic illustration of the processing circuitry for a chain code encoder having position data and synchronization data embedded within the same code sequence.

FIG. 8 is the timing diagram for the circuitry of FIG. 7.

FIG. 9 is a flow diagram which illustrates the manner in an N bit chain code can be generated.

FIG. 10 is a 3000 element, twelve-bit chain code.

FIG. 11 is a simplified flow diagram which illustrates the process by which a $2^N$ element chain code can be truncated to provide less than $2^N$ position words.

FIG. 12 is an illustrative example of the truncation process of FIG. 11.

FIG. 13 is a simplified functional block diagram of a linear positional encoder constructed in accordance with the present invention.

BEST MODE FOR CARRYING OUT THE INVENTION

Referring to FIG. 1A a four bit chain code is illustrated. This four bit chain code has a code sequence 10 comprised of sixteen elements. The elements are arranged in an ordered sequence such that any four consecutive bits in the code sequence 10 define a unique word. At the bottom left hand corner of FIG. 1A the four bit consecutive sequence for each position word number is shown. Thus, word number four comprises the four consecutive bits of 1110, which can be seen in the bottom left hand corner of FIG. 1A to be unique from any other consecutive four bits within the code sequence.

It can therefore be seen that any four consecutive bits in code sequence 10 define a unique position within the code sequence. Further, if the bit to either side of a selected four bit word is examined, its value is indicative of whether the four bit word is valid. One property of a chain code is that there is only one valid neighbor on either side of a chain code word. Any other state is invalid. Thus, by examining the next incoming bit of the chain code sequence it can be determined whether the current position data is valid.

In operation, the code sequence is positioned to rotate with and about the axis of rotation of the rotating member. In practice, the chain code sequence can be placed on a portion of the rotating member, or on a code disk which is attached to the rotating member. FIG. 1B is a simplified illustration of a four bit chain code track 14 having sixteen total elements, and associated clock track 16 positioned on a code disk 12.

FIG. 2 illustrates an embodiment in which the code disk 12 is attached to the rotating member. In FIG. 2, a chain code track 14 and a clock track 16 are positioned on disk 12. Detectors 18 are positioned at a fixed point relative to the rotating code disk 12 so as to read the code elements which pass in registration with the fixed point. In the embodiment illustrated in FIG. 2, photo optic devices are used, including light emitting diodes (LED) 20A and 20B, and photo detectors 22A and 22B.

Light emitting diode 20B is positioned so that it generates a beam of light which is incident upon chain code track 14 at the fixed point. Similarly, LED 20A is positioned to generate a beam of light which is incident upon the clock track 16 of code disk 12 at the fixed point. Photo detector 22B is positioned to intercept the reflected light from code track 14 and similarly, photo detector 22A is positioned to intercept the reflected light from clock track 16.

It is to be understood that other forms of detectors can be used such as capacitance, transmittance, magnetic, or the like. Further, it is to be understood that the code sequence can be placed on the code disk to permit transmissive type detection, where the code track varies between an opaque condition and a transparent condition. A light source, or the like, is disposed on one side of the disk, and a light receiver, or the like, is positioned to received the transmitted signal on the other side of the disk.

The signals provided by photodetectors 22A and 22B are "squared-up" by comparator circuits 24 and 26 respectively. A suitable comparator is device type LM339 or LM393 manufactured by National Semiconductor Corporation of Santa Clara, California. The "squared-up" clock signal from comparator circuit 24 is applied to the clock input of a serial in, parallel out shift register 28. A suitable shift register is device type 74LS164 manufactured by Signetics Corporation of Sunnyvale, California.

The "squared-up" position data from comparator circuit 26 is applied to the input of shift register 28. As code disk 12 rotates, position data from chain code track 14 are shifted into shift register 28 in synchronism with the clock signal from clock track 16. As the position data are shifted into shift register 28, position words are formed at the parallel outputs of shift register 28. These parallel words are then supplied to the decoder 30 which translates the position words into positional information.

Referring to the table of FIG. 1A, the position word which is applied to decoder 30 corresponds to the "word" column, while the positional information supplied by decoder 30 corresponds to the "word number" column of FIG. 1A.

Decoder 30 can take the form of a semiconductor memory or the like which is addressable by the position word from shift register 28 and which stores positional information at the various addresses.

Because shift register 28 can be of any length, more than just the N bit positional word being decoded can be temporarily held in shift register 28. Thus, decoder 30 can be addressed by an additional bit from shift register 28 which corresponds to an adjacent bit of the current N bit word. As discussed above, in a chain code sequence, adjacent bits of a position word are uniquely defined. Thus decoder 30 can be formatted to indicate whether the adjacent bit is correct and, if not, to supply an invalid data indication 32.

The above described chain encoder embodiment is especially useful where the rotating member rotates in a predetermined direction. This is because the formation of a valid position word assumes that the order of the position data, e.g. least significant bit first to most significant bit last, is always the same. If such were not the case, the decoding circuit could confuse the position word presented to it with one having the same collection of bits but a reversed order. For example, in the table in FIG. 1A, word number 0 and word number 14 both have a logic 1 as a leading or trailing bit, with the remainder of the bits having a logic 0 value. In order for the decoding circuit 30 to distinguish between these word numbers, it is important that the order of the bits remain the same.

It can be seen from FIG. 1A that for a clockwise direction, and assuming most significant bit first, word number 14, for example, will be read out as 0001, while for a counterclockwise direction, word number 14 will be read out as 1000.

The embodiment illustrated in FIG. 3 provides a bi-directional chain code encoder, that is, an encoder which automatically compensates for the change in direction of rotation of the rotating member.

This embodiment employs four separate tracks: (1) a chain code sequence 34 for use with clockwise rotation, (2) a chain code sequence 36 for use with counterclockwise rotation, (3) a first clock track 38, and (4) a second clock track 40 which is positioned in quadrature, i.e. 90 degrees out of phase, with the first clock track 38. Generally, the embodiment shown in FIG. 3 utilizes the relative change in pattern of first and second clock tracks 38 and 40, respectively, to distinguish between a clockwise and a counterclockwise direction of rotation. In turn data from the appropriate code track is selected for input into a shift register.

Photodiode 42 receives light which is reflected from counterclockwise code track 36. The signal generated by the incident light is applied to threshold detector 44. Threshold detector 44 shapes the signal from photodiode 42 so that a distinct transition between a logic 0 and logic 1 level can be supplied on line 46. Line 46 is provided to the shift left input 48 of shift register 50.

Photo diode 52 receives light which is reflected from clockwise track 34. Threshold detector 54 operates in a manner similar to Threshold detector 44, in providing the distinct transitions between a logic 1 and a logic 0 level in the input signal from photo diode 52. This signal is applied to line 56 and thereby applied to the shift left data input 58 of shift register 50.

Photo diode 60 receives light reflected from first clock track 38. Threshold detector circuit 62 further defines the transitions between logic 1 and logic 0 levels. Schmidt trigger circuits 64 "square up" these transitions so that sharply defined edges are provided in the clock signal. The output of Schmidt trigger circuits 64 is provided to one input each of NAND gates 66 and 68.

Photo diode 70 receives light which is reflected from clock track 40. The signal from photo diode 70 is further defined by threshold detector 72 and "squared-up" by Schmidt trigger circuit 74. The "squared-up" second clock signal is applied to the rising edge input of one shot multivibrator 76, and the falling edge input of one shot multivibrator 78. One shot 76 and 78 are configured to provide an output pulse upon the presence of an appropriate edge, which pulse has a predetermined width that is small with respect to the period of clockwise code track and counterclockwise code tracks 34 and 36, respectively. Suitable one shot devices include device type 74LS123 manufacture by Signetics Corporation of Sunnyvale, California.

The output of one shot 76 is applied to an input of NAND gate 66, while the output of one shot 78 is applied to an input of NAND gate 68.

In turn, the outputs of NAND gates 66 and 68 are NANDed together by NAND gate 70 and inverted by NAND gate 72 to provide the clock signal to shift register 50 on line 73. Further, the output of NAND gate 66 is applied to the set input of flip flop 74, while the output of NAND gate 68 is applied to the clear input of flip flop 74. The output of flip flop 74 is provided to the shift left/shift right control input of shift register 48.

The combination of the quadrature clock arrangement, the rising edge detection by one shot 76 and the falling edge detection by one shot 78, along with the logic provided by NAND gate 66 and 68 to control the output of flip flop 74, provides the processing by which the clockwise or counterclockwise rotation of the code disk can be detected.

Referring to FIG. 4A, the manner in which this detection is accomplished will be now described in greater detail. The waveform from first clock track 38 is represented by the symbol $phi_1$ while the signal from the second clock track 40 is represented by the waveform labeled $phi_2$. As can be seen from FIG. 4A, $phi_1$ is shifted 90 degrees with respect to waveform $phi_2$.

FIG. 4A illustrates the various waveforms for a counterclockwise rotation. In the FIG. 4A, units of time increase from left to right. The rising and falling edges of second clock $phi_2$ are shown by arrowheads positioned on the waveform transitions. Recall that one shot 76 detects the rising edges of clock $phi_2$, while one shot 78 detects the falling edges of clock $phi_2$. The waveforms for one shot 76 and one shot 78 illustrate the pulse generated by the respective one shot circuits when the respective edges are detected.

The output of NAND gate 72, FIG. 3, is illustrated by the waveform labeled, CLK-SHIFT REG. Recall that the output of NAND gate 66 and 68 are NANDed together in gate 70 to provide the clock for shift register 50. The waveform output by NAND gate 66 and applied to the set input of flip flop 74 is shown in FIG. 4A as waveform NAND 66. Similarly the waveform output by NAND gate 68 and applied to the clear input of flip flop 74 is labeled NAND 68. The output of flip flop 74 is labeled F.F. 74. Finally, the data supplied to the shift right input 58 of shift register 50 is labeled SHIFT RIGHT DATA.

The output of shift register 50 which evidences the shifting in of data is labeled SHIFT REG. OUT $Q_A$ in FIG. 4A.

As discussed above, the time axis increases from left to right. Thus, the clock waveform $phi_2$ shows a first edge which is falling, a second edge which is rising, a third edge which is falling, and a fourth edge which is rising. In response to clock $phi_2$, one shot 76 provides an output pulse 80 upon the occurrence of each rising edge in CLOCK $phi_2$. Similarly, one shot 78 is shown providing an output pulse upon the occurrence of each falling edge of clock $phi_2$.

Recall that NAND gate 66 NANDs together the output of one shot 76 and clock $phi_1$. Thus, the output of NAND gate 66 is a logic "1" except for the point in time at which pulse 80 is provided by one shot 76. This results in a logic zero level 82 at the output of NAND gate 66 for the duration of pulse 80. Conversely, NAND gate 68 NANDs together the output of one shot 78 and clock waveform $phi_1$. As can be seen by examination of these two waveforms, neither waveform attains a logic one level at the same time. Therefore, the output of NAND gate 68 is always a logic one level.

In the embodiment shown in FIG. 3, flip flop 74 provides a logic one output, when a logic zero is presented at its set input, and provides a logic zero output, when a logic zero is provided at its clear input. Thus, as can be seen from FIG. 4A, when the output of NAND gate 66 (the set signal) attains a logic zero level 82, the output of flip flop 74 is set to a logic one level.

Whenever a logic one is applied to the shift control input 84, the shift register shifts data, as applied at shift left input 48, to the left. From the SHIFT LEFT DATA waveform and the SHIFT REG. OUT waveform in FIG. 4A, it can be seen that, upon the transition of the output of flip flop 74 to a logic one level, and upon the occurrence of a rising edge in the CLK-SHIFT REG. waveform, data which is applied at the shift left data input appears at shift register output $Q_A$.

Coincident with the first rising edge of CLK-SHIFT REG. waveform in FIG. 4a, the SHIFT LEFT DATA waveform is shown to have a logic one level, which causes SHIFT REG. OUT waveform to attain a logic one level. At the second rising edge of the CLK-SHIFT REG. waveform, the SHIFT LEFT DATA waveform has a logic zero level. This level is shown as appearing in the SHIFT REG. OUT waveform coincident with the second rising edge in the CLK-SHIFT REG. waveform.

For the clockwise rotation case, FIG. 4B illustrates the timing sequence therefor. In FIG. 4B, time is shown increasing from right to left. Thus, clock $phi_2$ is shown from right to left as having first a falling edge 84, then a rising edge 86, a falling edge 88, and finally a rising edge 90. Waveforms are illustrated as in FIG. 4A, except that the bottom two waveforms illustrate the waveform applied to the shift right data input 58 and the waveform which results at the shift register output 92. These latter waveforms are provided since data is being shifted in towards the right during the clockwise rotation condition.

Note, in the clockwise rotation situation, that the output of NAND gate 66 remains at a logic one level, while the output of NAND gate 68 attains a logic zero level for the duration of the output pulse from one shot 78. Recall that the output of NAND gate 68 is applied to the clear input of flip flop 74. Whenever the output of NAND gate 68 attains a logic zero level, flip flop 74 is cleared to provide a logic zero level at its output.

Another way to view the operation of this circuitry is that it detects a lead/lag relationship between the rising and falling edges of the second clock $phi_2$ and that of the first clock $phi_1$. For example, if $phi_2$ goes positive and $phi_1$ is still a logic one, $phi_2$ lags $phi_1$ to indicate a counter clockwise rotation. If $phi_2$ goes positive and $phi_1$ is already negative, $phi_1$ lags $phi_2$ to indicate a clockwise rotation.

In the embodiment of the present invention shown in FIG. 3, shift register 50 responds to a logic zero applied at its shift control input by shifting data to the right. Thus, in FIG. 4B the logic one that is present in the SHIFT RIGHT DATA waveform at clock pulse 96 is shifted into the register 50, and appears at shift register output $Q_C$, upon the rising edge of clock waveform 96. Similarly, upon the occurrence of clock waveform 98, the logic level present at shift right data line 58 is a logic zero. This logic zero is shifted into shift register 50 and appears at the shift register output upon the occurrence of the rising edge in the clock waveform 98.

In the above manner, the circuitry of FIG. 3 automatically determines the direction of rotation of the code disk and causes the shifting into shift register 48 of the appropriate chain code waveform in the appropriate direction.

Shift register 50 can be a shift register having parallel and serial input capabilities as well as parallel and serial output capabilities. One such suitable such device is shift register type 74LS198 manufactured by Signetics Corporation of Sunnyvale, Calif. FIG. 3 shows two such devices coupled in series so as to accommodate positions words having up to 16 bits per word. With such a device, the shift left function is accomplished in the normal manner by applying data to be shifted at input 48. A logic one applied on line 84 indicates to the shift register 50 that a serial input is to be received.

When the logic level applied at line 84 is a logic zero, the shift register 50 accepts parallel input data. In FIG. 3 the outputs of the shift register are shown connected to the corresponding next lower input so as to affect a shifting of data to the right. For example, output $Q_H$ is shown fed back to input G.

The outputs of shift register 50 are shown in FIG. 3 as addressing memory circuit 100. Stored in memory circuit 100 is a look up table similar to that shown in FIG. 1. The output of memory circuit 100 can be selected to be any form of binary position code word. For example, the output can be in a natural binary form, or a binary coded decimal form.

Further, the position word being shifted through shift register 50 can be examined in light of its adjacent bits so as to indicate whether the data being received is valid, and also to designate an index mark. The index mark can be arbitrarily selected to correspond to any one of the position words and as such permits great versatility in the use of the encoder.

As discussed earlier, the look up table can also provide other information and special purpose signals, such as motor commutation signals, or multiple-pulse index signals. The employment of the decoding means in this embodiment, and all of the other embodiments described herein greatly increase the versatility of a positional encoder constructed in accordance with the present invention.

The bad data or invalid data indications can be obtained by examining an bit adjacent to the position word currently being decoded. The look up table stored in memory 100 can be structured so that the additional bit value being supplied to address the memory 100 addresses locations which provide a data invalid signal where the adjacent bit value is not as expected, and which provides a data valid signal when the adjacent bit value is as expected.

One drawback of the bi-directional encoder structure described in conjunction with FIG. 3 is that four different tracks are required and hence four channels of detecting and processing circuitry are also required. Referring to FIG. 5, a further embodiment of the present invention will now be described in which position and synchronization data are embedded within the same code track. In FIG. 5 the code track is shown as taking the form of a reflective code pattern that is positioned directly on the rotating member 102. A light emitting diode 104 illuminates the code track 106. Reflections from the the code track are received by the photo detector 108 and squared up by processing circuitry 110. It is to be understood that processing circuitry is similar to that discussed in connection FIG. 3 and can include a Threshold detection circuit as well Schmidt trigger circuits. The chain code signal from processing circuitry 110 is then applied to a phase comparator 112 and to the data input of shift register 114.

At this point it is instructive to examine the manner in which the position data and synchronizing data are embedded in the same code track. See FIG. 6. At the top of FIG. 6 the reflective code pattern embodiment of the code track 106 is shown. The code track comprises areas of highly reflective material 116 interspersed with areas of highly light-absorptive material 118. The chain code of this embodiment is formed by a series of code cycles 120, see the chain code waveform of FIG. 6. Each cycle has the same duration, however, the duty cycle of each code cycle is varied according to whether the position data is a logic one or a logic zero. In the embodiment illustrated in FIG. 6, a logic one condition is indicated by a code cycle having a duty cycle of 66 percent while a logic zero is indicated by a code cycle having a duty cycle of 33 percent. These duty cycle variations are implemented in the reflective code pattern 106 by varying the widths of the reflective elements therein.

In order to decode the above discussed chain code, a clock is generated with a period beginning at the rising edge of the chain code code cycle and having a 50 percent duty cycle. As can be seen from FIG. 6, upon the falling edge of such a clock, the chain code waveform has a state which corresponds to the position data value for that code cycle.

In order to generate such a clock, a phase locked loop is utilized. In FIG. 5 the chain code signal from processing circuit 110 is provided to one input of phase comparator 112. The other input to phase comparator 112 is provided from a voltage controlled oscillator (VCO) 122. The frequency of VCO 122 is controlled by the output of phase comparator 112. Phase comparator 112 compares the phase difference between the rising edges of the chain code signal and the VCO 122, and supplies a control signal to VCO 122 which tends to minimize the difference. VCO 122 is constructed so as to provide an output waveform which has a 50 percent duty cycle. This waveform is also supplied to the clock input of shift register 114.

Shift register 114 is selected so that it responds to the signal at its clock input by shifting in the logic level of the chain code waveform which exists at the 50 percent duty cycle point of the clock waveform. This can be achieved by selecting a shift register which is responsive to the falling edge of a clock waveform. As the position data from the chain code signal is shifted into shift register 114, the position word resident in the shift register 114 is supplied to decoder circuit 124. Decoder circuit 124 can take the form of a read only memory.

Referring to FIG. 7, the single track system of FIG. 6 will now be described in greater detail. LED 104 is used to illuminate a small portion of a cycle of the code pattern with a radial line source of light. The light reflected off of the code pattern is detected by the photo voltaic cell 108 and amplified by integrated amplifier 126. Assuming for the moment that the code disk 102 is rotating. The AC component of the signal from photocell amplifier 126 is fed to voltage comparator 128 which converts the analog signal to the digital form shown in FIG. 8, waveform A. One cycle of this digital signal contains both absolute position and clocking information. In FIG. 8 the positive or rising edges of waveform A occur at regular intervals for counter clockwise rotation of the code disk. The position data has been encoded on this signal by varying the duty cycle from 33 percent for a logical "0" to 66 percent for a logical "1". The absolute position in information can be recovered by sampling the code waveform at the 50 percent point, and using the previous $N-1$ bits of position data to form the absolute position word. This can typically be done by clocking the data into a shift register of at least N bits in length.

The digital signal from voltage comparator 128 propagates through Exclusive-OR (XOR) gate 130 to one of the inputs of phase comparator 132. The other input to phase comparator 132 is supplied by a voltage controlled oscillator (VCO) contained within phase comparator 132. It is to be understood that there are numerous embodiments of phase locked loops which employ a phase comparator, VCO and loop filter. One such embodiment is part number MC14046B manufactured by Motorola of Phoenix, Arizona. Such a device contains all of the phase locked-loop elements in a single package. Thus, pin 14 of device 132 is one of the phase comparator inputs, while pin 3 is the other. Pin 4 provides the VCO output. The frequency of the VCO is adjusted by the signal at pin 9. This signal is the filtered output of the phase comparator, pin 13.

The output of the VCO is used to create a clock signal with a 50 percent duty cycle, to be used in clocking position data into the shift register. The positive transition of the VCO is phase-locked to the positive edge of the signal coming from the code disk 102. See FIG. 8, waveforms B and C. The signal from the VCO is inverted by XOR gate 134 and applied to the clock input of shift register 136. The inversion of the VCO signal is provided where the shift register 136 clocks in data on the positive transition of its clock. Suitable shift registers include part number MC14094B manufactured by Motorola of Phoenix, Arizona. Two such devices are used to extend the possible length of the position word up to 16 bits in length. Waveform D of FIG. 8 illustrates the shift register clock after inversion through XOR gate 134.

For the embodiment being described, there can be more than 3000 unique position words which can appear at the outputs of shift register 136 for each revolution. Eraseable Programmable Read Only Memory (EPROM) 138 is used to convert the position words into signals which indicate the position of the rotating member, to provide a once around index mark, and an indication of when data from the encoder is invalid.

While an N bit chain code can have $2^N$ position words, such a quantity is not a requirement for proper operation of the invention. Certain positional words can be removed from the chain code sequence without affecting the uniqueness of the remaining positional words. For example, in FIG. 1 the elements 1101 which make up word number 5 can be removed from the code sequence to provide a sequence with ten unique 4-bit positional words.

The index mark is a once around pulse of a predetermined duration occurring at a specific position of the code wheel 102. The index mark can be located at any position of the code wheel 102 by reprogramming the EPROM 138 with the proper look-up table.

In order to provide valid position data at the outputs of shift register 136 when the code wheel 102 is rotated in the opposite direction, clockwise, the VCO should be locked on to the same physical edges of the code wheel signal, as shown in waveforms A1–D1 of FIG. 8. However, for a clockwise rotation, these edges change from "rising" edges for movement from right to left in FIG. to "falling" edges for movement to the left in the diagram. When the code disk 102 rotates in a clockwise direction, XOR gate 130 is used to invert the code disk signal that is applied to phase comparator 132, so that the VCO will be locked on the proper edge. The signal coming in on pin 2 of gate 130 is the inverted direction signal. Placing a logical "1" on the direction line will cause the VCO to lock onto the proper edge of the scan code signal.

For a given code disk position, the position word appearing at the outputs of shift register 138 will be dependent on the direction of rotation. It is therefore desirable to have two different look-up tables, one for each direction of rotation. These look-up tables are stored in EPROM 138. The state of address line A12 determines which look-up table to use.

When this embodiment of the present invention is used in a continuous rotation application, no electrical adjustments are required for the processing circuitry. In turn, manufacturing costs can be greatly reduced. In contrast, with traditional encoders, DC signal levels from the photo detectors are typically involved. These DC levels are applied to level detectors. These level detectors must be adjusted to calibrate their trigger levels to the output range of the photo detectors.

There are 4096 possible position words which can appear at the outputs of shift register 136, only 3000 of them are valid. If one of the remaining 1096 words appears on these output lines, the line D3, D2, and D1 of EPROM 138 will be set to a logical "1" state. These three outputs can be ANDed together to provide a data invalid indication, wherein a logical "1" indicates such a condition.

Referring now to FIG. 9, the manner in which the N-bit position words in the chain code sequence of the present invention are generated will now be described. In Step 140, all N bit positions are set to zero. Thereafter, in step 142 the bit values in the position word are shifted to the left and a logical "1" is added in the least significant bit position. Next, the new position word is compared, in step 144, against previously generated position words to determine if there is a match. If so, the least significant bit is set to a logic "0", step 146, and saved, step 148. If, on the other hand there is no match detected, the word is saved in step 148.

Thereafter, step 150 is executed to determine whether $2^N$ position words have been generated. If so, the procedure is halted. If not, steps 142 and following are reexecuted.

FIG. 10 illustrates a chain code sequence for 3000 position words. This sequence was generated in accordance with the procedure of FIG. 9. While 4096 total position words were generated, 1096 were discarded.

FIG. 11 provides a simplified flow diagram of the process by which position words can be selected for discarding. In this diagram, the letter "I" corresponds to the position word currently being compared, and "I+P" corresponds to the position word to which position word "I" is being compared.

It is helpful at this point to describe the process in connection with an example. See FIG. 12 in which a 4-bit chain code sequence having 16 elements is truncated to a 4-bit chain code sequence having 10 elements. In step 152, FIG. 11, "I" and "P" are initialized. The Ith word of the sequence is retrieved in step 154. Initially, this corresponds to word "0", FIG. 12, column 174, i.e. 1111.

In step 156, this word is compared against word "I+P", in the example, word "1", FIG. 12, column 174. Step 158 determines whether all of the bits of the two words match, except for the least significant bit (LSB). In the present illustration, the answer is yes.

Step 160 is processed next. In this step, the code sequence elements corresponding to the LSB of code words "I" up to, but not including, the LSB of word "I+P" are removed from the code sequence. Thus, in the illustration, the code sequence element "1" is removed. See reference number 162 in FIG. 12.

Step 164 is processed next to determine the number of position words remaining in the sequence. Step 166 is next processed to determine whether too many words have been removed. In the illustration, 15 words remain and a sequence providing 10 words is desired. Thus, the next step processed is step 168. In this step a check is made to determine whether the proper number of position words are now present. If not, step 172 is next processed.

Step 172 resets the iterative comparison process of step 154. As the word numbers are reassigned due to the elimination of bits from the code sequence, former word "I+P" will become new word "I". In the illustration, "I" was equal to 0 and word "0" was eliminated. Word "I+P" originally corresponded to word "1" but was reassigned word number "0" due to the elimination of step 160.

An examination of the column 174 of FIG. 12, but with original word "1" being removed, reveals that there are no other "matches" between current word "0" and the other words in the sequence. Steps 158, 180 and 182. In these steps, each successive position word is compared against position word "I". Step 180 watches for the last word in the code sequence, while step 182 increments "P" for the next word. When in step 180 the last word of the sequence is reached, step 184 is executed to increment "I" and reset "P".

Thus, when it is determined that word "0" has no more "matches", column 174, word "1" is next retrieved for comparison against the rest of the code sequence. In column 176 a "match" is shown between word "1" and word "4", step 158. In step 160, elements "1-1-0" are removed from the code sequence. See reference numeral 186. Former word "4" becomes word "1". The resulting code sequence and position words are shown in column 178, FIG. 12.

With respect to column 178, no matches are found until word "2" matches with word "7". However, in step 166 it is determined that elimination of the corresponding code elements would result in too few remaining position words. Therefore, in step 188, the code elements that were just eliminated (in step 160) are restored, and processing is resumed with the next word, in this case word "3".

No more "matches" are found until word "4" is found to "match" word "6". Accordingly, elements "1-0" are removed, see reference numeral 190. This results in the desired 10 element sequence shown at the bottom of the Figure. Step 192 is then executed to terminate the processing.

While the present inventions has been described in terms of rotational encoders, it is to be understood that the present invention is also useful in linear encoders. See FIG. 13. In such an application, the same code and clock tracks as in the rotational encoder case can be employed with the ends 192 of the tracks being aligned with the mechanical boundaries of the moving member 194. The detecting, processing and decoding circuitry 196 will be the same as in the rotational encoder case. In such an application, the bi-directional embodiment is preferred.

The terms and expression which have been employed herein are used as terms of description and not of limitation and there is no intention in the use of such terms and expression of excluding equivalents of the features shown and described, or portions thereof, it being recognized that various modifications are possible within the scope of the invention claimed.

We claim:

1. An apparatus providing information of the position of a rotating member having an axis of rotation, comprising code means positioned for rotation with the rotating member for providing a code sequence of code cycles arranged circumferentially about the axis of rotation of the rotating member, wherein each code cycle is associated with a unique position of the rotating member and provides position data, and further wherein the position data from each code cycle, in combination with the position data from adjacent N-1 consecutive code cycles, defines a pattern which is unique from the pattern formed by the position data from any other N consecutive code cycles in the code sequence, so that each N consecutive code cycles identify a unique position of the rotating member wherein the code sequence comprises a series of bits formed by the bits occupying a selected bit position in each of the words in a sequence of N-bit code words the sequence of N-bit code words being formed according to the steps of:
   a. beginning with all N-bits of a first N-bit code word in a first logic state;
   b. shifting the bits in the first N-bit code word by one bit position so that a bit position is vacated;
   c. setting the vacated bit position to a second logic state, different from the first logic state, to form a new N-bit code word and assigning the new N-bit code word to the sequence of N-bit code words if the new N-bit code word does not match any of the other N-bit code words in the sequence of N-bit code words;
   d. setting the vacated bit position to the first logic state to form an alternate N-bit code word and assigning the alternate N-bit code word to the sequence of N-bit code words if the new N-bit code word of step "c" matches any of the other N-bit code words in the sequence of N-bit code words; and
   e. repeating steps "b" through "d" until $2^N$ N-bit code words are present in the sequence of N-bit code words, wherein in step "b" the "first N-bit code word" is replaced by the N-bit code word that was assigned to the sequence of N-bit code words in steps "c" and "d";

means for reading the code cycles of the code sequence which are brought into instantaneous registration with a monitoring point as the rotating member is rotated, wherein the monitoring point is fixed in position relative to the rotating member;

means coupled to the reading means for extracting the position data from the code cycles being read by the reading means and for temporarily storing the position data in the order received; and means coupled to the extracting and storing means for converting the consecutive sequence of the N most recently received position data into positional information.

2. The apparatus of claim 1 wherein the code sequence is truncated to form a truncated code sequence which has less than $2^N$ code cycles, and further wherein the truncated code sequence is formed following the completion of step "e" according to the steps of:

f. selecting an N-bit code word in the sequence of N-bit code words;

g. locating a comparison N-bit word which is subsequent to the selected N-bit code word in the sequence of N-bit code words, wherein all but the least significant bit of the selected and the comparison N-bit code words match;

h. deleting the selected N-bit code word and all N-bit code words up to, but not including, the comparison N-bit code word if the number of N-bit code words remaining will be more than or equal to the number of code cycles desired in the truncated sequence;

i. repeating steps "f" through "h" until the desired number of code cycles is reached, wherein in step "f" the N-bit code word which is next selected is the comparison N-bit code word if a deletion occured in step "h", or the next N-bit code word following the selected N-bit code word if no deletion occured in step "h".

3. The apparatus of claim 1 wherein the each code cycle in the code sequence comprise a combination of light and dark regions, and further wherein the reading means include photo-optic detector means for detecting the occurrence of the light and dark regions of the code sequence.

4. The apparatus of claim 3 wherein the photooptic means comprise a light source positioned to illuminate a limited region of the code sequence; and photo-detector means for detecting the change in the quantity of light reflected or transmitted by the code sequence.

5. The apparatus of claim 1 wherein the extracting and storing means comprise shift register means having a serial input, parallel outputs, and a clock input, for shifting data applied at the serial input in synchronism with a clock signal applied at the clock input.

6. An apparatus providing information of the position of a rotating member having an axis of rotation, comprising code means positioned for rotation with the rotating member for providing a code sequence of code cycles arranged circumferentially about the axis of rotation of the rotating member, wherein each code cycle is associated with a unique position of the rotating member and provides position data, and further wherein the position data from each code cycle, in combination with the position data from adjacent N-1 consecutive code cycles, defines a pattern which is unique from the pattern formed by the position data from any other N consecutive code cycles in the code sequence, so that each N consecutive code cycles identify a unique position of the rotating member;

means for reading the code cycles of the code sequence which are brought into instantaneous registration with a monitoring point as the rotating member is rotated, wherein the monitoring point is fixed in position relative to the rotating member;

means coupled to the reading means for extracting the position data from the code cycles being read by the reading means and for temporarily storing the position data in the order received; and means coupled to the extracting and storing means for converting the consecutive sequence of the N most recently received position data into positional information, wherein each of the code cycles include synchronizing information and the position data are encoded by varying the duty cycle in the code cycle, so that synchronizing information and position data are included in a single code sequence, and further wherein the extracting and storing means include means coupled to the reading means for deriving the synchronizing information from the code cycles being read; and means responsive to the synchronizing information for designating the point in the code cycle being read which is indicative of the position data.

7. The apparatus of claim 6 wherein the code sequence provides a waveform which includes a rising edge which indicates the beginning of each code cycle and the driving means comprise means for generating a clock signal which is phase-locked to the rising edge of each code cycle in the code sequence, and further wherein the clock signal has a predetermined duty cycle which is selected to provide a falling edge which occurs at approximately the midpoint of the range over which the duty cycle for encoding the position data is permitted to vary.

8. An apparatus providing information of the position of a rotating member having an axis of rotation, comprising code means positioned for rotation with the rotating member for providing position data and synchronizing information, including a first sequence of code cycles arranged circumferentially about the axis of rotation of the rotating member, wherein each code cycle is associated with a unique position of the rotating member and provides position data, and further wherein the position data from each code cycle, in combination with the position data from adjacent N−1 consecutive code cycles, defines a pattern which is unique from the pattern formed by the position data from any other N consecutive code cycles in the code sequence, so that each N consecutive code cycles identify a unique position of the rotating member; and a first clock sequence positioned circumferentially about the axis of rotation of the rotating member;

first means for reading the clock sequence and for reading the code cycles of the code sequence which are brought into instantaneous registration with a monitoring point as the rotating member is rotated, wherein the monitoring point is fixed in position relative to the rotating member;

means coupled to the reading means for extracting the position data from the code cycles being read by the reading means in accordance with the clock sequence and for temporarily storing the position data in the order received; and means coupled to the extracting and storing means for converting the consecutive sequence of the N most recently received position data into positional information, wherein the first sequence of code cycles is valid for a first direction of rotation;

a second sequence of code cycles which is valid for a direction of rotation which is opposite the first direction of rotation and arranged circumferentially about the axis of rotation of the rotating member, wherein each code cycle is associated with a unique position of the rotating member and provides position data, and further wherein the position data from each code cycle, in combination with the position data from adjacent N-1 consecutive code cycles, defines a pattern which is unique from the pattern formed by the position data from any other N consecutive code cycles in the code sequence, so that each N consecutive code cycles identify a unique position of the rotating member;

a second clock sequence positioned circumferentially about the axis of rotation of the rotating member and in quadrature with respect to the first clock sequence;

second means for reading the second clock sequence and for reading the code cycles of the second code sequence which are brought into instantaneous registration with a monitoring point as the rotating member is rotated, wherein the monitoring point is fixed in position relative to the rotating member, and further wherein the second code sequence is supplied to the extracting and storing means; and means coupled to the first and second reading means for determining direction of rotation from the relative transitions of the first and second clock sequences, wherein said determining means controls the extracting and storing means to store position data from the first or second code sequences as a function of the direction of rotation of the rotating member.

9. The apparatus of claim 8 wherein the first and second clock sequences provide waveforms having a duty cycle of approximately fifty percent such that the rising edges of the second clock sequence waveform lead the rising edges of the first clock sequence waveform when the rotating member is rotating in one direction, and so that the rising edges of the second clock sequence waveform lag the rising edges of the first clock sequence waveform when the rotating member is rotating in the opposite direction, and further wherein direction determining means include means for detecting the rising and falling edges of the second clock sequence waveform; and lead/lag means for determining whether the rising edges of the second clock sequence waveform are leading or lagging the rising edges of the first clock sequence waveform.

10. The apparatus of claim 9 wherein the first clock sequence waveform varies between a logic-one and a logic-zero state and detecting means comprise first and second edge-triggered multivibrators, and further wherein the first edge-triggered multivibrator provides a rise pulse of predetermined length on the rising edges of the second clock sequence waveform and the second edge-triggered multivibrator provides a fall pulse of predetermined length on the falling edges of the second clock sequence waveform; and further wherein the lead/lag determining means include flip flop means receiving a set and a clear input for providing a first sequence command upon receipt of a set input to cause the extracting and storing means to store position data from the first code sequence, and for providing a second sequence command upon receipt of a reset input to cause the extracting and storing means to store position data from the second code sequence;

first logic means coupled to the flip flop means and to the first edge-triggered multivibrator for providing a set signal to the flip flop means when the rise pulse occurs during the logic-one state of the first clock sequence waveform; and second logic means coupled to the flip flop means and to the second edge-triggered multivibrator for providing a clear signal to the flip flop means when the fall pulse occurs during the logic-one state of the first clock sequence waveform.

11. The apparatus of claim 10 wherein the first and second edge triggered multivibrator are one-shot multivibrators.

12. The apparatus of claim 10 wherein the extracting and storing means comprise a parallel/serial-in, parallel-out shift register having shift-right and shift-left control lines and data inputs and which receives the first code sequence waveform at the shift-right data input, the second code sequence waveform at the shift-left data input, the first sequence command at the shift-right control line, and second sequence command at the shift-left control line.

13. The apparatus of claim 12 wherein the converting means comprise memory means for storing a conversion table which correlates the position data pattern for each N consecutive code cycles in the code sequence to a preassigned position indication for the rotating member.

14. An apparatus providing information of the position of a member which moves linearly between a first position and a second position, comprising code means positioned for movement with the member for providing position data and synchronizing information, including a first sequence of code cycles positioned along the moving member so that the first sequence is translated into registration with a monitoring point that is fixed in relation to the moving member as the member is translated between the first and second positions, wherein each code cycle is associated with a unique position of the member and provides position data, and further wherein the position data from each code cycle, in combination with the position data from adjacent N−1 consecutive code cycles, defines a pattern which is unique from the pattern formed by the position data from any other N consecutive code cycles in the code sequence, so that each N consecutive code cycles identify a unique position of the member wherein the code sequence comprises a series of bits formed by the bits occupying a selected bit position in each of the words in a sequence of N-bit code words the sequence of N-bit code words being formed according to the steps of:

a. beginning with all N-bits of a first N-bit code word in a first logic state;

b. shifting the bits in the first N-bit code word by one bit position so that a bit position is vacated;

c. setting the vacated bit position to a second logic state, different from the first logic state, to form a new N-bit code word and assigning the new N-bit code word to the sequence of N-bit code words if the new N-bit code word does not match any of the other N-bit code words in the sequence of N-bit code words;

d. setting the vacated bit position to the first logic state to form an alternate N-bit code word and assigning the alternate N-bit code word to the sequence of N-bit code words if the new N-bit code word of step "c" matches any of the outer N-bit code words in the sequence of N-bit code words; and e. repeating steps "b" through "d" until $2^N$ N-bit code words are present in the sequence of N-bit code words, wherein in step "b" the "first N-bit code word" is replaced by the N-bit code word that was assigned to the sequence of N-bit code words in steps "c" and "d"; and a first clock sequence positioned along the moving member so that the first clock sequence is translated into registration with the monitoring point, the clock sequence supplying synchronizing information;

first means for reading the clock sequence and for reading the code cycles of the code sequence which are brought into instantaneous registration with the monitoring point as the member is translated between the first and second positions;

means coupled to the reading means for extracting the position data from the code cycles being read by the reading means in accordance with the clock sequence and for temporarily storing the position data in the order received; and means coupled to the extracting and storing means for converting the consecutive sequence of the N most recently received position data into positional information.

15. The apparatus of claim 14, wherein the code sequence is truncated to form a truncated code sequence which has less than $2^N$ code cycles, and further wherein the truncated code sequence is formed following the completion of step "e" according to the steps of:

f. selecting an N-bit code word in the sequence of N-bit code words;

g. locating a comparison N-bit word which is subsequent to the selected N-bit code word in the sequence of N-bit code words, wherein all but the least significant bit of the selected and the comparison N-bit code words match;

h. deleting the selected N-bit code word and all N-bit code words up to, but not including, the comparison N-bit code word if the number of N-bit code words remaining will be more than or equal to the number of code cycles desired in the truncated sequence;

i. repeating steps "f" through "h" until the desired number of code cycles is reached, wherein in step "f" the N-bit code word which is next selected is the comparison N-bit code word if a deletion occured in step "h", or the next N-bit code word following the selected N-bit code word if no deletion occured in step "h".

* * * * *